United States Patent [19]

Maeda et al.

[11] Patent Number: 5,407,908
[45] Date of Patent: Apr. 18, 1995

[54] METHOD OF MANUFACTURING AN OXIDE SUPERCONDUCTOR

[75] Inventors: Toshihiko Maeda, Tokyo; Kazuhiro Sakuyama, Ichikawa; Shin-ichi Koriyama, Urayasu; Ataru Ichinose, Yokosuka; Hisao Yamauchi, Urayasu; Shoji Tanaka, Tokyo, all of Japan

[73] Assignees: International Superconductivity Technology Center, Tokyo; Tohoku Electric Power Company, Incorporated, Miyagi; Central Research Institute of Electric Power Industry; The Furukawa Electric Co., Ltd., both of Tokyo, all of Japan

[21] Appl. No.: 91,832

[22] Filed: Jul. 13, 1993

Related U.S. Application Data

[62] Division of Ser. No. 712,264, Jun. 7, 1991, Pat. No. 5,252,544.

[30] Foreign Application Priority Data

Jun. 14, 1990 [JP] Japan .................. 2-157026

[51] Int. Cl.$^6$ ............................. H01L 39/12
[52] U.S. Cl. .................. 505/492; 423/604; 505/501
[58] Field of Search .............. 505/1, 725, 775, 776, 505/777, 778, 779, 492, 501; 264/65, 66; 423/604

[56] References Cited

U.S. PATENT DOCUMENTS 5,262,393 11/1993 Wada et al. ................ 505/775

OTHER PUBLICATIONS

Subrananian "Superconductivity Near Liquid Nitrogen Temperature . . . " *Physica C* V. 157 Jan. 1, 1989, pp. 124–130.

Gai "Grain Boundary Atomic Structure and Microstructure . . . ", Nat. Res. Soc. Symp. Proc. V. 138, 1989, pp. 151–156.

Rouillon, "$Pb_2Sr_2LnCeCu_3O_{10}$, A New Member . . . ", *Physics C,* V. 167, Apr. 15, 1990, pp. 107–111.

Nobumasa "Layered Copper Oxides Designed By The Combination . . . ", Z. Phys. B—Condensed Matter, V 83, Apr. 1991, pp. 19–22.

Maeda, "New Lead-Based Layered Cuprate Superconductors", AIP Conf. Proc., 219 (Supercond. Its Appl.), 1991, Abstract only.

Kharlanov "The New Family of Complex Copper Oxides . . . ", *Physics C* V. 119 (5–6), 1990, pp. 469–475 (Abstract only as seen in parent).

Nature, vol. 336, Nov. 17, 1988, pp. 211–214 R. J. Cava, (List continued on next page.)

*Primary Examiner*—Christopher A. Fiorilla
*Attorney, Agent, or Firm*—Frishauf, Holtz, Goodman & Woodward

[57] ABSTRACT

A method for manufacturing a Pb-based Cu oxide superconductor. The method includes the steps of mixing powders of a raw material containing at least Pb, Sr, Ce, M, where M is at least one element selected from the group consisting of Y, La, Nd, Sm, Eu, Gd, Tb, Dy, Ho, Er, Yb, and Lu, and Cu in a proportion to have the composition of the formula (I), $$Pb_a(M_{1-x-y}Ce_xSr_y)_4Cu_{3-a}O_z \qquad (I)$$

where M is at least one element selected from the group consisting of Y, La, Nd, Sm, Eu, Gd, Tb, Dy, Ho, Er, Yb, and Lu, and a, x, y, and z denote the numbers which satisfy $0.3 \leq a \leq 0.7$, $0 < x \leq 0.25$, $0.3 \leq y < 0.5$, $8.5 \leq z \leq 9.5$, respectively, forming the mixed powder into a shaped body, and firing the shaped body at a temperature of 900° to 1150° C. in an oxidizing atmosphere.

11 Claims, 5 Drawing Sheets

OTHER PUBLICATIONS et al, Superconductivity Near 70 K in a New Family of Layered Copper Oxides.

Physics C 159 pp. 201–209, T. Rouillon, et al Superconductivity up to 100 K in Lead Cuprates: A New Superconductor, Apr. 26, 1989.

Physics C 161 pp. 459–467, A. Tokiwa et al Crystal Structure and Phase Transition of PbBaSrYCuxOy (y=7–8.4) Oct. 6, 1989.

Japanese Journal of Applied Physics, vol. 29, No. 6, Jun. 1990 pp. 890–892, Superconductivity in "1201" Lead Cuprate, Seijji Adachi, et al.

Journal of the Physical Society of Japan, vol. 58, No. 7, Jul. 1989, pp. 2252–2255, A New Family of Superconducting Copper Oxides:, Hiroshi Sawa, et al.

Patent Abstracts of Japan vol. 13, No. 145 (C–583) (3493) 10 Apr. 1989; & JP-A-63307114 (Nippon Teleg & Teleph Corp (NTT)) 14 Dec. 1988.

Patent Abstracts of Japan vol. 14, No. 314 (C–737)(4257), 5 Jul. 1990; & JP-A-2107518 (Matsushita Electric Ind Co Ltd) 19 Apr. 1990.

Chemical Abstracts vol. 114, No. 2, 14 Jan. 1991, pp. 469–475, abstract No. 15701a, Columbus, Ohio, US; A. Kharlanov et al: "The new family of complex copper oxides with possible superconductiong properties: lead strontium rare earth cerium copper oxide (Pb2Sr2 R1.33Ceo.67Cu3O10+delta)." & Physica C (Amsterdam) 1990, vol. 169, No. 5–6, pp. 469–475.

Chemical Abstracts vol. 112, No. 4, 22 Jan. 1990, abstract No. 29249e, Columbus, Ohio, US; & CN-A—87102231 (Faming Zhuanli Shenqing Gongkai Shuomingshu) 12 Oct. 1988.

METHOD OF MANUFACTURING AN OXIDE SUPERCONDUCTOR

This is a division of application Ser. No. 07/712,264 filed Jun. 7, 1991, now U.S. Pat. No. 5,252,544.

BACKGROUND OF THE INVENTION

1. Field of the Invention

The present invention relates to an oxide superconductor having a novel composition and its manufacturing method.

2. Description of the Related Art

As oxide superconductors containing Pb and Cu (hereinafter called "Pb-based Cu oxide superconductor"), $Pb_2Sr_2(Ca,Y)Cu_3O_8$ with 2213 phase crystal structure (see R. J. Cava et al., Nature 336, pp 211, 1988), $Pb_2(Sr,La)_2Cu_2O_6$ with 2202 phase structure (see H. W. Zandbergen et al., Physica C 159, pp 81, 1989), $(Pb,Sr)Sr_2(Y,Ca)Cu_2O_7$ (see T. Rouillon et al., Physica C 159, pp 201, 1989) or $(Pb,Cu)(Sr,Ba)_2(Y,Ca)Cu_2O_7$ (see S. Koriyama et al., Physica C 166, pp 413, 1990), both with 1212 phase structure, $PbSrBa(Y,Ca)Cu_3O_8$ with 1213 phase structure (see A. Tokiwa et al., Physica C 161, pp 459, 1989), $(Pb,Cu)(Sr,La)_2CuO_5$ with 1201 phase structure (see S. Adachi et al., Jpn. J Appl. Phys. 29 pp. 1890, 1990) have been known.

Because in these superconductors, the oxygen content in its composition is nonstoichiometric (unable to be reduced to simple integer ratio), the numbers denoting oxygen content in the above-mentioned compositional formulae indicate the ideal value. In actuality, it is assumed that the oxygen content deviates slightly from the above numbers. Of the Pb-based Cu oxide superconductors of above-mentioned composition, those containing Y are known to exhibit superconductivity characteristics even if other rare earth elements are used in place of Y.

Now when superconducting materials are used in various sensors and devices, various characteristics are required according to respective applications. For example, they must have suitable critical temperatures, must be easy to be synthesized, must have the precise structure, or must be easy to handle.

Investigating the above-mentioned Pb-based Cu oxide superconductors in respect to these viewpoints, synthesis of say a 2213-phase structure, a 2202-phase structure, and a 1213-phase structure Pb-based Cu oxide superconductors is carried out by firing material powders, a mixture of oxides, carbonates and so on, in reducing atmospheres. During firing the material powders, pinpoint control of oxygen partial pressure in the atmosphere is essential and furthermore, rapid cooling is required after firing, and therefore, such Pb-based Cu oxide superconductors are not always synthesized easily. Of the 1212-phase structures, those comprising $(Pb_{0.5}Sr_{0.5})Sr_2(Y,Ca)Cu_2O_7$ must have their synthesis carried out in the vacuum atmosphere.

In this way, Pb-based Cu oxide superconductors of 2213 phase, 2202 phase, 1213 phase, and 1212 phase structures with the aforementioned composition are not always easy to be synthesized. Furthermore, synthesis of Pb-based Cu oxide superconductors with the above-mentioned structures is carried out in either a reducing or a vacuum atmosphere as described above. In general, the melting point of oxides is lowered in such atmosphere. Consequently, the firing temperature must be lower than that in oxidizing atmospheres, resulting in a problem that Pb-based Cu oxide superconductors obtained are difficult to be densified.

Of Pb-based Cu oxide superconductors of the 1201-phase structure and the 1212-phase structure, those comprising $(Pb,Cu)(Sr,Ba)_2(Y,Ca)Cu_2O_7$ can be synthesized in an oxidizing atmosphere and the problem as mentioned above would not occur. However, Pb-based Cu oxide superconductors of this composition contain a high content of Pb, a harmful element, requiring careful handling. This constitutes a disadvantage to produce a practical Pb-based Cu oxide superconductors.

SUMMARY OF THE INVENTION

The object of this invention is to provide a new Pb-based Cu oxide superconductor and its manufacturing method, which can solve the above-mentioned problems related to Pb-based Cu oxide superconductors, which does not need special controls for the baking temperature and any rapid cooling process, which can be easily and finely synthesized in the suitable oxidizing atmosphere, and which contains only a small amount of Pb.

The 1222-phase structure contains a structure unit known as a fluorite layer. And of copper oxides containing this fluorite layer, those such as $(Nd,Ce)_2(Nd,Ba)_2Cu_3O_9$, which exhibits superconductivity, exist (see H. Sawa et al., J. Phys. Soc. Japan, 58, pp 2252, 1989).

The inventors of the present invention had considered the fact that many of the Cu oxide superconductors containing this fluorite layer contain Ce and can be synthesized to Pb-based Cu oxide superconductors in the oxidizing atmosphere similar to $(Pb,Cu)(Sr,Ba)_2(Y,Ca)Cu_2O_7$, and that the Pb-based Cu oxide superconductors of a 1222-phase structure is expected to contain less Pb than the aforementioned conventional Pb-based Cu oxide superconductors with a 1212-phase structure, and have succeeded in developing the Pb-based Cu oxide superconductor of the present invention.

That is, the present invention provides oxide superconductors having the composition expressed by the following formula:

$$Pb_a(M_{1-x-y}Ce_xSr_y)_4Cu_{3-a}O_z$$

(where M represents at least one element selected from the group consisting of Y, La, Nd, Sm, Eu, Gd, Tb, Dy, Ho, Er, Yb, and Lu, and a, x, y, and z denote the numbers which satisfy $0.3 \leq a \leq 0.7$, $0 < x \leq 0.25$, $0.3 \leq y < 0.5$, $8.5 \leq z \leq 9.5$, respectively) and the crystal structure is of the 1222 phase structure. The present invention provides a Pb-based Cu oxide superconductor manufacturing method comprising the steps of mixing powders of raw materials containing at least Pb, Sr, Ce, M (where M represents at least one element selected from the group consisting of Y, La, Nd, Sm, Eu, Gd, Tb, Dy, Ho, Er, Yb, and Lu) and Cu in the proportion to have the above-mentioned composition, optionally forming the mixed powder of raw materials into a shaped body and firing the obtained powder mixture or the shaped body in the temperature range of 900°–1150° C. in the oxidizing atmosphere.

The oxide superconductors of the present invention are Pb-based Cu oxide superconductors which possess the above-mentioned composition and whose crystal structure is of the 1222-phase.

Additional objects and advantages of the invention will be set forth in the description which follows, and in part will be obvious from the description, or may be learned by the practice of the invention. The objects and advantages of the invention may be realized and obtained by means of the instrumentalities and combinations particularly pointed out in the appended claims.

BRIEF DESCRIPTION OF THE DRAWINGS

The accompanying drawings illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
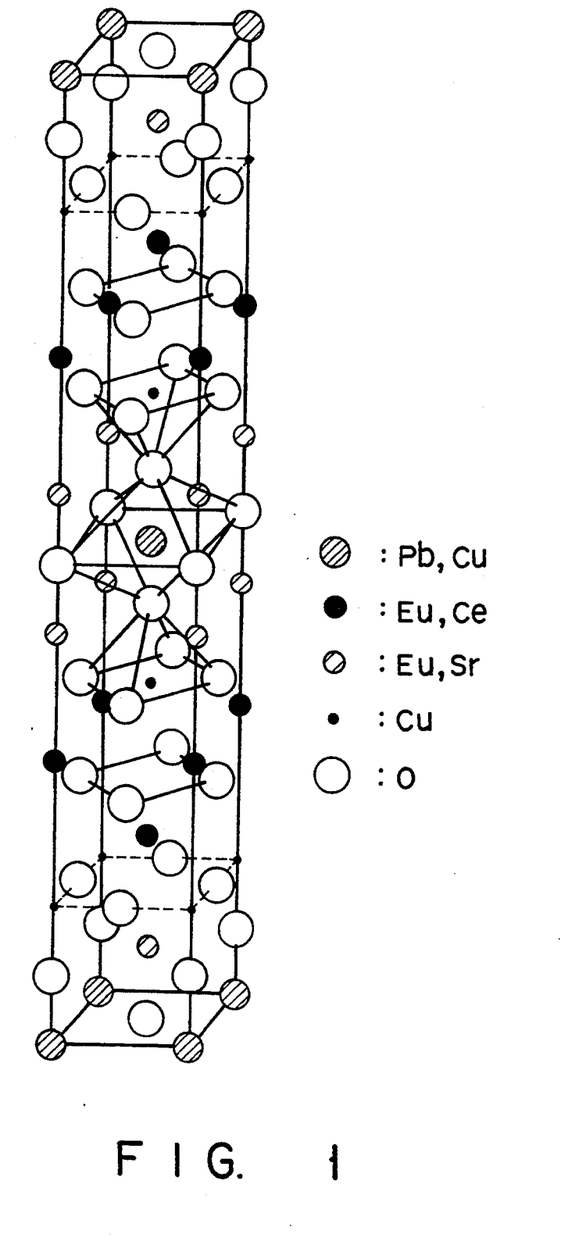
FIG. 1 is a schematic diagram showing a crystal structure of Pb-based Cu oxide superconductors of the present invention.

FIG. 1 shows an example of the crystal structure of Pb-based Cu oxide superconductor of the present invention when M in the above composition is Eu.

The crystal structure of this case is a tetragonal crystal of the lattice constant a of about 3.8 Å and c of about 29 Å which is known as a material of $TlBa_2(M,Ce)_2Cu_2O_8$ (where M is the same as above) and Pb—Pr—Sr—Cu—O systems (for the Tl system, see S. Martin et al., Mcd. Phys. Lett. B3, pp 993, 1989 and for the Pb system, see S. Adachi et al., Physica C 168, pp 1, 1990). However, these are not superconducting materials.

In Pb-based Cu oxide superconductors of the present invention, because when the character a is smaller than 0.3 or larger than 0.7, impurity phases such as the 1212 phase are generated in the crystal structure in addition to the 1222 phase and this generation degrades superconducting characteristics, the value a must be restricted to the range of 0.3–0.7.

Character x indicating the Ce content is also restricted to the range of $0 < x \leq 0.25$. Deviating from this range will result that Pb-based Cu oxide superconductors of the 1222-phase structure cannot be obtained.

Character y indicating the Sr content is also restricted to the range of $0.3 \leq y < 0.5$. Deviating from this range will result that Pb-based Cu oxide superconductors of the 1222-phase structure cannot be obtained as with the case of character x.

The oxygen content z varies according to firing conditions and cooling conditions later discussed, but must be the amount that allows the obtained synthesized substance to be an oxide superconductor. Specifically, it is restricted to the range of $8.5 \leq z \leq 9.5$. This is because deviation of z from this range degrades the superconducting properties.

The Pb-based Cu oxide superconductor of the present invention can be synthesized as follows. First, powders of raw materials containing Pb, Ce, Sr, Cu, and M are thoroughly mixed. Examples for raw materials used in this event include oxides containing the elements described above, carbonates, nitrates, oxalates, hydroxides, etc.

The mixture ratio of each materials is decided in such a way that the above-mentioned metallic elements contained in the materials constitute the composition of $Pb_a(M_{1-x-y}Ce_xSr_y)_4Cu_{3-a}$ after synthesis.

According to the present invention, the obtained powder mixture of raw material is calcined at 800° to 900° C. in an oxidizing atmosphere. After the calcined powder is formed into the desired shaped by a molding method such as a press molding, an injection molding, an extrusion molding and a sheet molding, the shaped body is fired.

Then, the obtained calcined powder or the shaped body is fired in the oxidizing atmosphere. In an oxidizing atmosphere, the oxygen partial pressure need not specially be controlled as required conventionally and the applied atmosphere may be, say, ambient air, a 100% oxygen gas atmosphere, or an atmosphere which has an oxygen partial pressure higher than 0.05 atm.

The baking temperature is set to the temperature range from 900°–1150° C. When the firing temperature is lower than 900° C., 1222-phase structure generating reactions do not take place satisfactorily and synthesis of Pb-based Cu oxide superconductors of the above-mentioned composition and fine structure does not progress. When the firing temperature is higher than 1150° C., evaporation of Pb proceeds and impurity phases other than the 1222 phase structure begin to form accordingly.

In the temperature range mentioned above, reactions to generate the Pb-based 1222-phase structure take place while undergoing a partial melting state. For this reason, firing at the above-mentioned temperature range causes the reactions to generate the Pb-based 1222-phase structure to take place rapidly, and as a result, Pb-based Cu oxide superconductors with a 1222-phase structure of the present invention are synthesized in extremely short time. Preferable baking temperatures are 1000°–1080° C.

Excessively long firing times accelerate evaporation of Pb, resulting in deterioration of superconducting characteristics due to generation of impurity phases. Excessively short firing times result in insufficient generation of the 1222-phase structure, which proceeds in the partial melting state. It is, therefore, desirable to set the firing time to the range of 0.5–5 hours at the above-mentioned temperatures.

Upon completion of firing, the synthesized substance is cooled to obtain Pb-based Cu oxide superconductors of the present invention.

The desirable cooling rate at this event is 10° C./min or over up to the temperature right below the partial melting temperature (about 900° C.). Slower cooling rates than this increases the Pb evaporation rate. From the temperature right below the partial melting temperature to about 300° C. the cooling rate of 5° C./min or lower is desirable. A cooling rate higher than this results in insufficient take-in of oxygen during cooling, which is essential for occurrence of superconducting characteristics.

EXAMPLES 1–11, COMPARISON EXAMPLES 1–11

Powders of $PbO$, $CeO_2$, $Eu_2O_3$, $SrCO_3$, and $CuO$ (purity: all 99.9% or higher) were thoroughly mixed to have the composition shown in Table 1.

Each powder mixture obtained is calcined for 10 hours in the 850° C. air and formed into compacts having desired shape. The compacts were fired under the conditions mentioned in Table 1 and finally the fired compacts were cooled at a rate of 1° C./min.

For each sample obtained, the generated phase was confirmed by the X-ray diffraction method and electric resistivity was measured by the four-probe method to investigate superconducting characteristics.

Table 1 summarizes the above results.

Figure 2:
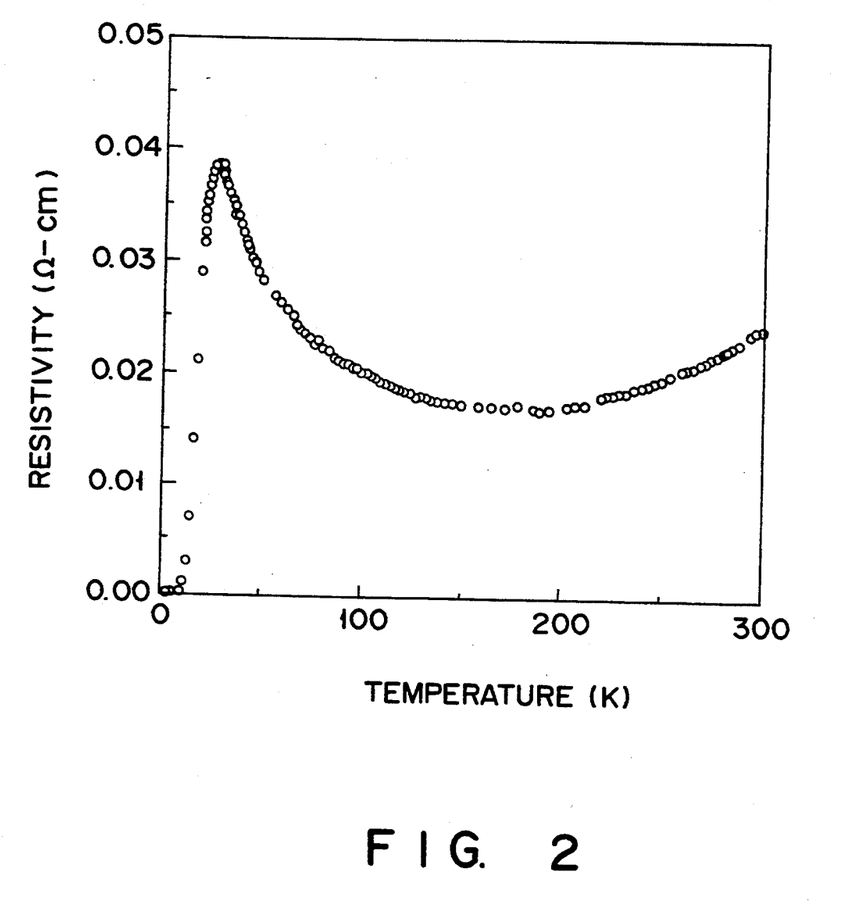
FIG. 2 is a graph showing the temperature dependency of electric resistivity in Embodiment (Example) 1.
Figure 3:
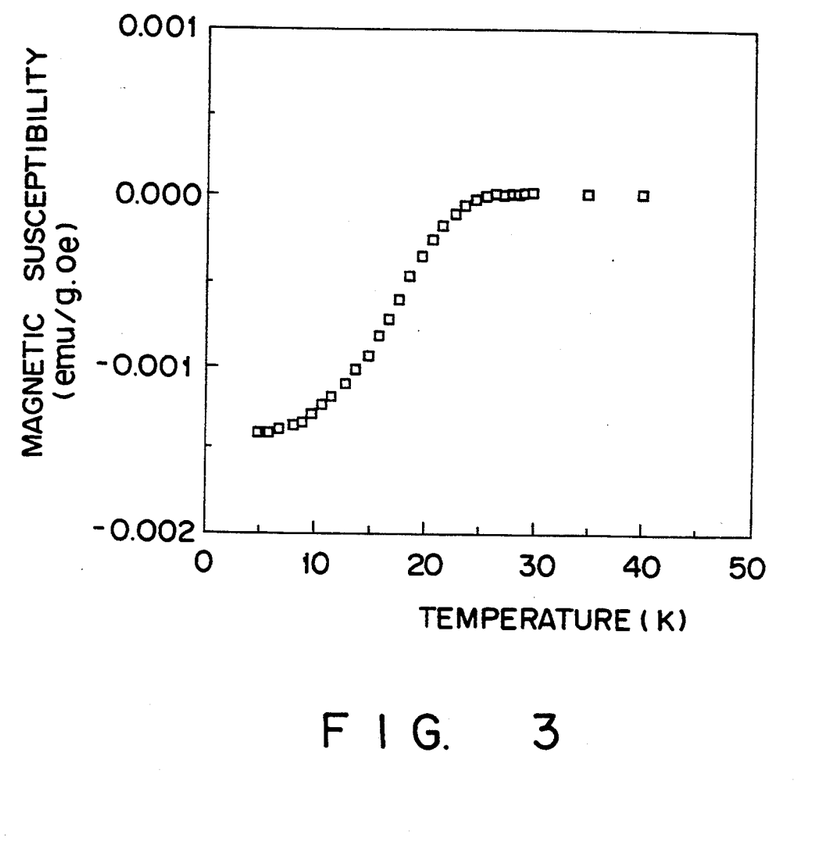
FIG. 3 is a graph showing the temperature dependency of d.c. magnetic susceptibility in Embodiment (Example) 1.

For the superconductor compacts of Embodiment 1, temperature dependency of electric resistivity and d.c. magnetic susceptibility were investigated and the results are shown in FIGS. 2 and 3. As clear from FIG. 2, the oxide superconductor of the present invention begins decreasing electric resistivity from 25K and attains zero at 12K by superconducting transition. As is clear from FIG. 3, magnetic susceptibility becomes negative at 25K or lower for the Meissner effect due to superconductivity.

Figure 4:
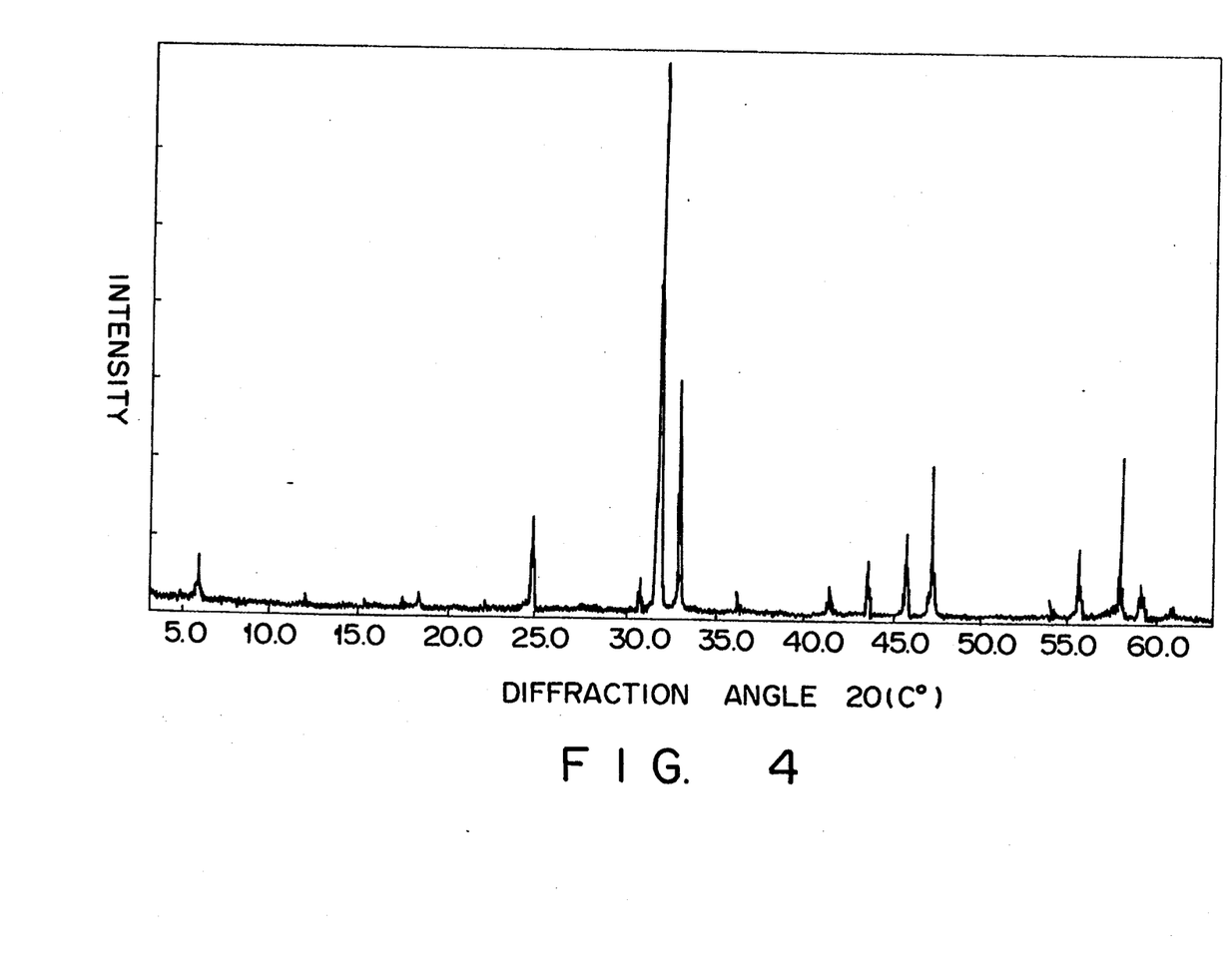
FIG. 4 is a graph showing an X-ray diffraction pattern in Embodiment 1.

FIG. 4 shows an X-ray (CuKα) diffraction pattern of the oxide superconductor of Embodiment 1. As is clear from FIG. 4, this oxide superconductor is a tetragonal crystal with the lattice constant a of about 3.8 Å and c of about 29.6 Å, and all the diffraction peaks can be characterized. It forms, as a whole, a single phase of 1222 phase structure.

EXAMPLES 12–28

As shown in Table 2, various oxide superconductors were synthesized in the manner similar to Embodiment 1 except a change of the type of element M. All oxide superconductors obtained were extremely densified. Table 2 shows the generated phases and superconducting characteristics together.

EXAMPLES 29–31

The powder mixture same as that of Embodiment 1 was fired under the same conditions and the fired compacts obtained were cooled to 850° C., 800° C., and 700° C., respectively, in 10 minutes, then cooled to room temperature at a rate of 1° C./min and three types of oxide superconductor compacts of varying cooling conditions were fabricated.

These three types of oxide superconductor compacts all had the 1222-phase crystal structure and the $T_c$ (onset) is all 28K, exhibiting characteristics superior to oxide superconductors of Embodiment 1.

EXAMPLE 32

Oxide superconductor compacts of Embodiment 1 were held at 800° C. for 1 hour in the 1 atm. oxidizing atmosphere and cooled to room temperature at a rate of 1° C./min. In the cooling process, oxide superconductor compacts were held at 600° C., 500° C., 400° C., and 300° C. for 10 hours, respectively.

Figure 5:
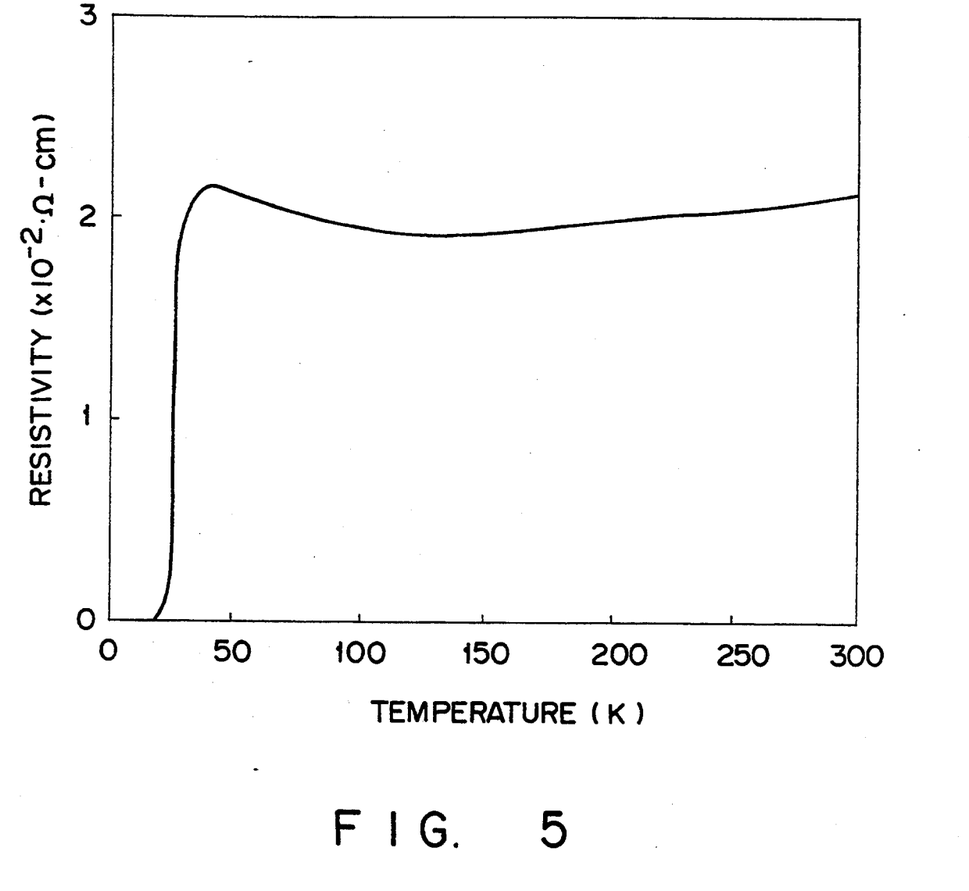
FIG. 5 is a graph showing the temperature dependency of electric resistivity in Embodiment (Example) 32.

Temperature dependency of electric resistivity was measured on heat-treated superconductor compacts obtained, and the results are shown in FIG. 5.

As shown in FIG. 5, lowering of electric resistivity due to superconducting transition was recognized at 30K or lower, and the characteristics are improved from those of Embodiment 1.

According to the X-ray diffraction, the crystal structure of the heat treated superconductor compacts is the 1222-phase structure and change of crystal structure due to heat treatment was not recognized.

As is clear from the above description, the oxide superconductor of the present invention is a new Pb-based Cu oxide superconductor with the 1222-phase structure, which has superconducting transition temperature of 20–30K and whose structure is extremely densified, and is very easy to handle because the Pb content is low. Because this oxide superconductor contains Pb, it provides excellent workability as compared to other oxide superconductors and can be used for new material for sensors and devices.

With the manufacturing method of the present invention, synthesis is carried out in the oxidizing atmosphere and firing temperature can be increased, and as a result, oxide superconductors with high density structure can be synthesized easily and at low cost.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

TABLE 1

| | $Pb_a(Eu_{1-x-y}Ce_xS r_y)_4 Cu_{3-a}O_9$ | | | Baking condition | | | | Superconducting characteristics | | | |
|---|---|---|---|---|---|---|---|---|---|---|---|
| | | | | Baking tempe- rature (°C.) | Baking time (hr) | Oxygen partial pressure (atm) | Generated Phase | Yes/ No | Tc (onset, K) | Tc (zero resist- ance, K) | Remarks |
| | a | x | y | | | | | | | | |
| Embodi- ment 1 | 0.5 | 0.125 | 0.4375 | 1080 | 1 | 1.0 | 1222 phase | Y | 25 | 12 | |
| Embodi- ment 2 | 0.5 | 0.125 | 0.4375 | 1080 | 1 | 0.2 | 1222 phase | Y | 20 | 11 | |
| Embodi- ment 3 | 0.5 | 0.125 | 0.4375 | 1000 | 1 | 1.0 | 1222 phase | Y | 22 | 10 | |
| Embodi- ment 4 | 0.5 | 0.125 | 0.3 | 1080 | 1 | 1.0 | 1222 phase + impurity phase | Y | 18 | 6 | |
| Embodi- ment 5 | 0.5 | 0.1 | 0.4375 | 1080 | 1 | 1.0 | 1222 phase | Y | 20 | 10 | |
| Embodi- ment 6 | 0.5 | 0.25 | 0.4375 | 1080 | 1 | 1.0 | 1222 phase + impurity phase | Y | 15 | 5 | |
| Embodi- ment 7 | 0.3 | 0.125 | 0.4375 | 1080 | 1 | 1.0 | 1222 phase + | Y | 13 | — | |

TABLE 1-continued

| | $Pb_a(Eu_{1-x-y}Ce_xSr_y)_4Cu_{3-a}O_9$ | | | Baking condition | | | | Superconducting characteristics | | | |
|---|---|---|---|---|---|---|---|---|---|---|---|
| | a | x | y | Baking temperature (°C.) | Baking time (hr) | Oxygen partial pressure (atm) | Generated Phase | Yes/No | Tc (onset, K) | Tc (zero resistance, K) | Remarks |
| Embodiment 8 | 0.7 | 0.125 | 0.4375 | 1080 | 1 | 1.0 | impurity phase 1222 phase + impurity phase | Y | 10 | — | |
| Embodiment 9 | 0.5 | 0.125 | 0.375 | 1080 | 1 | 1.0 | 1222 phase | Y | 20 | 11 | |
| Embodiment 10 | 0.5 | 0.125 | 5/12 | 1080 | 1 | 1.0 | 1222 phase | Y | 25 | 10 | |
| Embodiment 11 | 0.5 | 0.1 | 0.45 | 1080 | 1 | 1.0 | 1222 phase | Y | 19 | 9 | |
| Comparison 1 | 0.5 | 0.125 | 0.4375 | 1150 | 1 | 1.0 | 1222 phase + impurity phase | N | — | — | Slightly melted |
| Comparison 2 | 0.5 | 0.125 | 0.4375 | 900 | 1 | 1.0 | 1222 phase + impurity phase | N | — | — | |
| Comparison 3 | 0.5 | 0.125 | 0.4375 | 1080 | 1 | 0.05 | 1222 phase | N | — | — | |
| Comparison 4 | 0.5 | 0.125 | 0.5 | 1080 | 1 | 1.0 | Impurity phase | N | — | — | |
| Comparison 5 | 0.5 | 0.125 | 0.25 | 1080 | 1 | 1.0 | 1222 phase + impurity phase | N | — | — | |
| Comparison 6 | 0.5 | — | 0.4375 | 1080 | 1 | 1.0 | Impurity phase | N | — | — | |
| Comparison 7 | 0.5 | 0.3 | 0.4375 | 1080 | 1 | 1.0 | 1222 phase + impurity phase | N | — | — | |
| Comparison 8 | 0.2 | 0.125 | 0.4375 | 1080 | 1 | 1.0 | Impurity phase | N | — | — | |
| Comparison 9 | 0.8 | 0.125 | 0.4375 | 1080 | 1 | 1.0 | Impurity phase | N | — | — | |
| Comparison 10 | 0.5 | 0.125 | 0.4375 | 1080 | 6 | 1.0 | 1222 phase + impurity phase | Y | 15 | 6 | |
| Comparison 11 | 0.5 | 0.125 | 0.4375 | 1080 | 5 | 1.0 | 1222 phase | Y | 23 | 8 | |

TABLE 2

| | Type of element M in the composition | Generated phase | Superconducting characteristics | | |
|---|---|---|---|---|---|
| | | | Yes/No | Tc (onset, K) | Tc (zero resistance, K) |
| Embodiment 12 | Y | 1222 phase | Y | 20 | 11 |
| Embodiment 13 | La | 1222 phase + impurity phase | Y | 10 | — |
| Embodiment 14 | Nd | 122 phase + impurity phase | Y | 12 | — |
| Embodiment 15 | Sm | 1222 phase | Y | 19 | 6 |
| Embodiment 16 | Gd | 1222 phase | Y | 21 | 10 |
| Embodiment 17 | Tb | 1222 phase | Y | 21 | 9 |
| Embodiment 18 | DY | 1222 phase | Y | 20 | 9 |
| Embodiment 19 | Ho | 1222 phase | Y | 20 | 9 |
| Embodiment 20 | Er | 1222 phase | Y | 19 | 8 |
| Embodiment 21 | Yb | 1222 phase | Y | 18 | 8 |
| Embodiment 22 | Lu | 1222 phase | Y | 16 | 6 |
| Embodiment 23 | Eu + Ho | 1222 phase | Y | 22 | 13 |
| Embodiment 24 | Ho + Y | 1222 phase | Y | 20 | 12 |
| Embodiment 25 | Sm + Lu | 1222 phase | Y | 19 | 11 |
| Embodiment 26 | Eu + Nd | 122 phase + impurity phase | Y | 11 | — |
| Embodiment 27 | Er + Nd | 122 phase + impurity phase | Y | 8 | — |
| Embodiment 28 | Eu + Y + Ho | 1222 phase | Y | 17 | 9 |

What is claimed is:

1. A method for manufacturing a superconductor having a formula of $$Pb_a(M_{1-x-y}Ce_xSr_y)_4Cu_{3-a}O_z,$$

wherein M represents at least one element selected from the group consisting of Y, La, Nd, Sm, Eu, Gd, Tb, Dy, Ho, Er, Yb and Lu and a, x, y and z denote numbers which satisfy $0.3 \leq a \leq 0.7$, $0 < x \leq 0.25$, $0.3 \leq y < 0.5$, $8.5 \leq z \leq 9.5$, respectively, comprising the steps of:
   (a) mixing powders of raw materials containing at least Pb, Sr, Ce, M and Cu in a proportion which constitutes the formula $$Pb_a(M_{1-x-y}Ce_xSr_y)_4Cu_{3-a}O_z$$

after synthesis of the superconductor;
   (b) calcining the powder mixture at a temperature of 800° to 900° C. in an oxidizing atmosphere to obtain a calcined powder;
   (c) forming the calcined powder into a shaped body;
   (d) firing the shaped body at a temperature of 900° to 1150° C. in an oxidizing atmosphere to synthesize the superconductor; and
   (e) cooling the synthesized superconductor from a temperature right below a partial melting temperature of the superconductor to about 300° C. at a rate of 5° C./minute or lower.

2. The method according to claim 1 wherein the raw materials are compounds selected from the group consisting of oxides, carbonates, nitrates, oxalates, and hydroxides containing the elements in the formula $Pb_a(M_{1-x-y}Ce_xSr_y)_4Cu_{3-a}O_z$.

3. The method according to claim 1 wherein the oxidizing atmosphere is environmental air.

4. The method according to claim 1 wherein the oxidizing atmosphere is one in which the oxygen partial pressure is higher than 0.05 atm.

5. The method according to claim 4 wherein the firing temperature is 1000° to 1080° C. and carrying out the firing for 0.5 to 5 hours.

6. The method according to claim 1 wherein the firing temperature is 1000°–1080° C.

7. The method according to claim 1 wherein the firing is carried out for 0.5–5 hours.

8. The method according to claim 1 wherein the shaped body after firing is cooled to a temperature right below the partial melting temperature the superconductor at a rate of 10° C./min or higher.

9. A method for manufacturing a superconductor having a formula of $$Pb_a(M_{1-x-y}Ce_xSr_y)_4Cu_{3-a}O_z,$$

wherein M represents at least one element selected from the group consisting of Y, La, Nd, Sm, Eu, Gd, Tb, Dy, HO, Er, Yb and Lu and a, x, y and z denote numbers which satisfy $0.3 \leq a \leq 0.7$, $0 < x \leq 0.25$, $0.3 \leq y < 0.5$, $8.5 \leq z \leq 9.5$, respectively, comprising the steps of:
   (a) mixing powders of raw materials containing at least Pb, Sr, Ce, M and Cu in a proportion which constitutes the formula $$Pb_a(M_{1-x-y}Ce_xSr_y)_4Cu_{3-a}O_z$$

after synthesis of the superconductor;
   (b) calcining the powder mixture at a temperature of 800° to 900° C. in an oxidizing atmosphere to obtain a calcined powder;
   (c) firing the calcined powder at a temperature of 900° to 1150° C. in an oxidizing atmosphere to synthesize the superconductor; and
   (d) cooling the synthesized superconductor from a temperature right below a partial melting temperature of the superconductor to about 300° C. at a rate of 5° C./minute or lower.

10. The method according to claim 9 wherein the firing is carried out for 0.5 to 5 hours.

11. The method according to claim 10 wherein the firing temperature is 1000° to 1080° C.

* * * * *